United States Patent
Murakuki et al.

(10) Patent No.: US 7,016,247 B2
(45) Date of Patent: Mar. 21, 2006

(54) SEMICONDUCTOR MEMORY APPARATUS

(75) Inventors: Yasuo Murakuki, Kyotanabe (JP);
Masahiko Sakagami, Kameoka (JP);
Shunichi Iwanari, Soraku-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/023,663

(22) Filed: Dec. 29, 2004

(65) Prior Publication Data

US 2005/0146969 A1 Jul. 7, 2005

(30) Foreign Application Priority Data

Jan. 7, 2004 (JP) ............................. 2004-002433

(51) Int. Cl.
*G11C 7/00* (2006.01)
(52) U.S. Cl. ................. 365/225.7; 365/230.06
(58) Field of Classification Search ............. 365/225.7, 365/230.06
See application file for complete search history.

(56) References Cited

U.S. PATENT DOCUMENTS

| 5,323,348 | A | | 6/1994 | Mori et al. |
| 5,566,107 | A | * | 10/1996 | Gilliam ................... 365/225.7 |
| 5,862,097 | A | * | 1/1999 | Toda ..................... 365/230.06 |
| 6,026,036 | A | * | 2/2000 | Sekiya et al. .......... 365/230.08 |
| 6,400,618 | B1 | | 6/2002 | Nakamura et al. |

FOREIGN PATENT DOCUMENTS

JP 2001-351395 A 12/2001

\* cited by examiner

*Primary Examiner*—Tuan T. Nguyen
(74) *Attorney, Agent, or Firm*—McDermott Will & Emery LLP

(57) ABSTRACT

A semiconductor memory apparatus including a simple circuit configuration and is capable of randomly accessing fuse data. A fuse cell 30 including a fuse 31 is connected to a pair of bit lines of a memory circuit. The fuse 31 and a fuse data output circuit (which includes a resistor 32 and an inverter 33) are connected to a pair of bit lines BLT and BLB of the memory circuit through a fuse selection switch 34. By allowing a column decoder 12 for selecting a pair of bit lines of the memory cell to also function as a decoder circuit for selecting a fuse, the bit lines of the memory circuit can be used as signal lines for outputting fuse data, whereby the circuit size is reduced and the circuit area is reduced.

9 Claims, 15 Drawing Sheets

SEMICONDUCTOR MEMORY APPARATUS

BACKGROUND OF THE INVENTION

1. Field of the Invention

The present invention relates to a semiconductor memory apparatus, and in particular to a semiconductor memory apparatus containing fuses for storing error address information, chip ID information, data for circuit adjustment, etc.

2. Description of the Background Art

Semiconductor memory apparatuses, such as DRAM, SRAM, and FeRAM (Ferroelectric RAM), may include a plurality of fuses so as to non-volatilely store error address information used to correct errors, chip ID information, data for circuit adjustment, etc. To verify whether the fuses are disconnected properly, it is desirable that the data stored in the fuses (hereinafter referred to as the "fuse data") be easily accessible from the outside of the semiconductor memory apparatus. In addition, it is desirable that fuse data, such as chip ID information, be able to be referred to not only at the time of manufacturing test of the semiconductor memory apparatus but also at the time of normal operation of the semiconductor memory apparatus.

FIG. 19 is a diagram illustrating a configuration of a conventional semiconductor memory apparatus containing fuses, which is described in Japanese Laid-Open Patent Publication No. 2001-351395. The semiconductor memory apparatus shown in FIG. 19 includes I/O terminals 90, memory cell arrays 91, a DQ sense amplifier 92, fuses 93, first latches 94, second latches 95, a read control circuit 96, and test terminals 97. Reading and writing of data from/to the memory cell arrays 91 are performed through the I/O terminals 90. Fuse data stored in a fuse 93 is read by using a corresponding first latch 94, a corresponding second latch 95, and the read control circuit 96. More specifically, the data read from the fuse 93 is once transferred to the corresponding first latch 94 and then serially transferred to the corresponding second latch 95 in synchronization with a clock signal CLK. Thereafter, the read control circuit 96 is activated, whereby the fuse data stored in the corresponding second latch 95 is read through a corresponding test terminal 97.

The above-described conventional method, however, requires a data bus and a control circuit which are specially designed to read fuse data, making the circuit design complex and causing an increase in circuit area. In addition, since fuse data is serially transferred, it takes time to access the fuse data. Moreover, since a random access cannot be performed on fuse data, it is necessary to use an access sequence which is different from that used when reading data from a memory cell.

SUMMARY OF THE INVENTION

Therefore, an object of the present invention is to provide a semiconductor memory apparatus having a simple circuit configuration and is capable of randomly accessing fuse data.

The present invention has the following features to attain the object mentioned above. A first aspect of the present invention is directed to a semiconductor memory apparatus comprising a memory circuit, fuses, fuse data output circuits, a fuse selection circuit, and a fuse selection switch. The memory circuit includes memory cells, bit lines, a sense amplifier, a selection circuit for selecting a bit line, and a data line. The fuse data output circuits each output a signal in accordance with a disconnection/non-disconnection state of a corresponding fuse. The fuse selection circuit selects at least one circuit from the fuse data output circuits. The fuse selection switch connects, when reading corresponding fuse data, a corresponding fuse data output circuit selected by the fuse selection circuit to the data line of the memory circuit.

A second aspect of the present invention is directed to a semiconductor memory apparatus comprising a memory circuit, fuses, fuse data output circuits, and a fuse selection switch. In the semiconductor memory apparatus, the fuse selection switch connects a corresponding fuse data output circuit to a corresponding bit line of the memory circuit selected by the selection circuit of the memory circuit.

In this case, the number of fuses may be less than the number of bit lines of the memory circuit, and the bit lines may include a first bit line which is connected to a fuse; and a second bit line which is not connected to any fuse. In particular, the bit lines may include a plurality of the first bit lines and a plurality of the second bit lines. The first bit lines and the second bit lines may be all arranged in a region where the memory cells are arranged. Each second bit line may be fixed, when reading corresponding fuse data, to a predetermined potential corresponding to a low level or a high level. The sense amplifier may amplify a signal on a corresponding first bit line and may not amplify a signal on a corresponding second bit line, when reading corresponding fuse data.

Alternatively, in the case where the memory cells include a data storage memory cell and an error correction memory cell, the semiconductor memory apparatus may further comprise an output control circuit for controlling an output of the data line. The output control circuit may output, when reading memory data, a result obtained by performing error correction on data read from a corresponding data storage memory cell and a corresponding error correction memory cell, and may output, when reading fuse data, data read from a corresponding data storage memory cell as it is.

Alternatively, the sense amplifier may amplify, when reading corresponding memory data, a signal on a corresponding bit line, and may not amplify, when reading corresponding fuse data, a signal on a corresponding bit line.

These and other objects, features, aspects and advantages of the present invention will become more apparent from the following detailed description of the present invention when taken in conjunction with the accompanying drawings.

DESCRIPTION OF THE PREFERRED EMBODIMENTS

With reference to the drawings, semiconductor memory apparatuses according to the embodiments of the present invention will be described below. In the following description, if a is a nonnegative integer and b is an integer greater than a, (b−a+1) signals and (b−a+1) signal lines are each expressed as S (b:a) The i-th signal and a signal line are each expressed as S (i) (where i is an integer greater than or equal to a and less than or equal to b).

Figure 1:
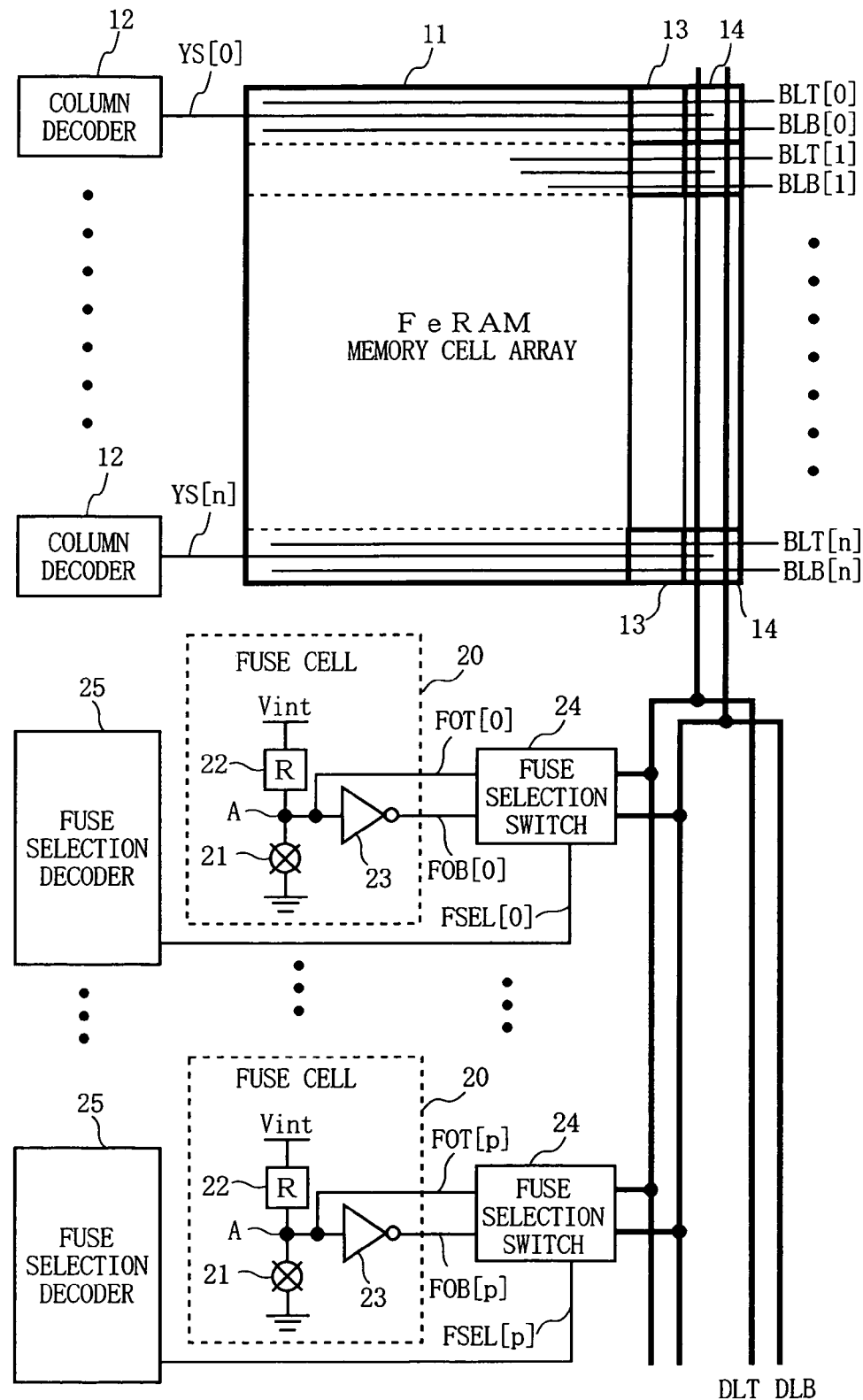
FIG. 1 is a diagram illustrating a configuration of a semiconductor memory apparatus according to a first embodiment of the present invention.

FIG. 1 is a diagram illustrating a configuration of a semiconductor memory apparatus according to a first embodiment of the present invention. The semiconductor memory apparatus shown in FIG. 1 is FeRAM containing physical fuses which can be physically disconnected using a laser trimmer. The semiconductor memory apparatus includes a FeRAM memory cell array 11 (hereinafter simply referred to as the "memory cell array 11"), column decoders 12, sense amplifiers 13, column selection switches 14, fuse cells 20 each having a fuse 21, fuse selection switches 24, and fuse selection decoders 25. The semiconductor memory apparatus is characterized in that a fuse cell 20 is connected to data lines of a memory circuit when reading fuse data.

In FIG. 1, the memory cell array 11, the column decoders 12, the sense amplifiers 13, and the column selection switches 14 compose a memory circuit having a general structure. More specifically, the memory cell array 11 has (m+1)×(n+1) memory cells (where m and n are any integer) arranged two-dimensionally. A memory cell from/to which data is read or written is selected using column selection signals YS (n:0) and word selection signals WL (m:0) (not shown). Each memory cell is connected to one pair of bit lines BLT (n:0) and BLB (n:0). The data read or written from/to a memory cell propagates through a corresponding pair of bit lines among the pairs of bit lines BLT (n:0) and BLB (n:0).

To select from the pairs of bit lines BLT (n:0) and BLB (n:0) a pair of bit lines used to read or write data, the column decoders 12 output column selection signals YS (n:0). The column decoders 12 select at most one signal from the column selection signals YS (n:0), and then control the selected signal to be in a selected state and other signals to be in a non-selected state. The column selection switches 14 connect at most one pair of bit lines selected from the pairs of bit lines BLT (n:0) and BLB (n:0) in accordance with the column selection signals YS (n:0), to data lines DLT and DLB. For example, when a column selection signal YS (i) (where i is an integer greater than or equal to 0 and less than or equal to n) is in a selected state, a corresponding column selection switch 14 connects bit lines BLT (i) and BLB (i) to the data lines DLT and DLB, respectively. The sense amplifiers 13 amplify signals on the pairs of bit lines BLT (n:0) and BLB (n:0).

The semiconductor memory apparatus shown in FIG. 1 has (p+1) fuse cells 20 (where p is any integer), and each fuse cell 20 is provided with its corresponding fuse selection switch 24 and fuse selection decoder 25.

Each fuse cell 20 includes a fuse 21, a resistor 22, and an inverter 23. The fuse 21 and the resistor 22 are connected in series and arranged between a power supply and ground. The potential of connection point A between the fuse 21 and the resistor 22 reaches substantially the ground level when the fuse 21 is in a connected state, and reaches the power supply voltage level when the fuse 21 is in a disconnected state. In this manner, the potential of the connection point A is determined to have either a high level or a low level depending on the disconnection/non-disconnection state of the fuse 21. Each connection point A has one of signal lines FOT (p:0) directly connected thereto and one of signal lines FOB (p:0) connected thereto through a corresponding inverter 23. By this, the fuse cells 20 output their respective pairs of signals FOT (p:0) and FOB (p:0). In this manner, each fuse cell 20 (specifically, the components of the cell 20 other than the fuse 21) functions as a fuse data output circuit for outputting a pair of signals in accordance with the disconnection/non-disconnection state of the fuse 21.

The fuse selection decoders 25 output fuse selection signals FSEL (p:0) in order to select from the (p+1) fuse cells 20 a fuse cell from which data is to be read. When all column selection signals YS (n:0) are in a non-selected state, the fuse selection decoders 25 select at most one signal from the fuse selection signals FSEL (p:0), and then control the selected signal to be in a selected state and other signals to be in a non-selected state. On the other hand, when one of the column selection signals YS (n:0) is in a selected state, the fuse selection decoders 25 control all fuse selection signals FSEL (p:0) to be in a non-selected state.

Each fuse selection switch 24 is provided between its corresponding fuse cell 20 and the data lines DLT and DLB. The fuse selection switches 24 connect at most one pair of signal lines selected from the pairs of signal lines FOT (p:0) and FOB (p:0) in accordance with the fuse selection signals FSEL (p:0), to the data lines DLT and DLB. For example, when a fuse selection signal FSEL (i) (where i is an integer greater than or equal to 0 and less than or equal to p) is in a selected state, a corresponding fuse selection switch 24 connects signal lines FOT (i) and FOB (i) to the data lines DLT and DLB, respectively.

The sequence of reading fuse data in the semiconductor memory apparatus shown in FIG. 1 will be described below. During a fuse data read cycle, all column selection signals YS (n:0) are controlled to be in a non-selected state, and all pairs of bit lines BLT (n:0) and BLB (n:0) are electrically disconnected from the data lines DLT and DLB. Under this state, the fuse selection decoders 25 control one signal from the fuse selection signals FSEL (p:0) to be in a selected state. In accordance with the fuse selection signals FSEL (p:0), the fuse selection switches 24 connect one pair of the signal lines FOT (p:0) and FOB (p:0) to the data lines DLT and DLB. By this, a pair of signals in accordance with the disconnection/non-disconnection state of a selected fuse 21 propagates through the data lines DLT and DLB. In this manner, fuse data can be read from the selected fuse 21.

As described above, according to the semiconductor memory apparatus of the present embodiment, fuse data can be randomly read using the same reading sequence as that of memory data. Accordingly, the state of fuses can be easily checked and fuse data can be easily read from application software.

Figure 2:
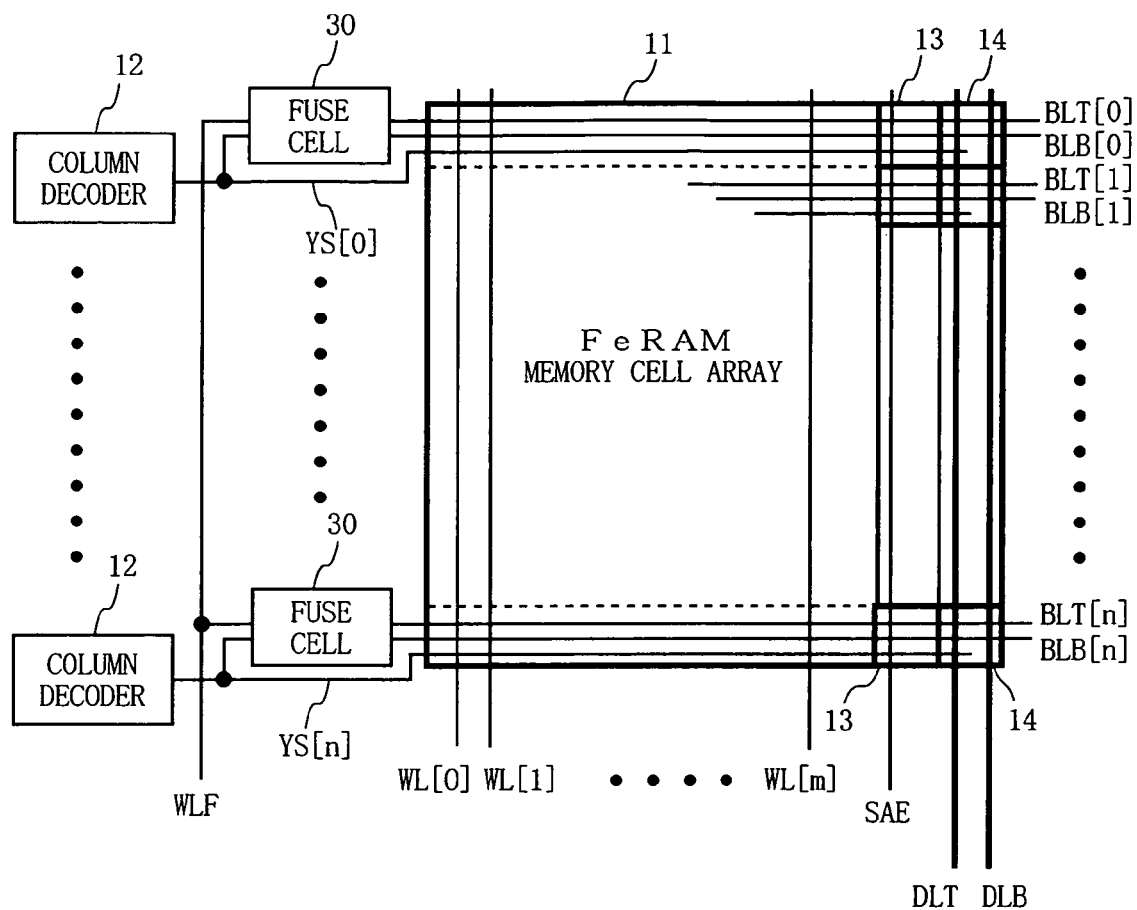
FIG. 2 is a diagram illustrating a configuration of a semiconductor memory apparatus according to a second embodiment of the present invention.

FIG. 2 is a diagram illustrating a configuration of a semiconductor memory apparatus according to a second embodiment of the present invention. The semiconductor memory apparatus shown in FIG. 2 is FeRAM containing physical fuses, as in the case of the first embodiment. The semiconductor memory apparatus includes a memory cell array 11, column decoders 12, sense amplifiers 13, column selection switches 14, and fuse cells 30. The semiconductor memory apparatus is characterized in that when reading fuse data, a fuse cell 30 is connected to a corresponding pair of bit lines of a memory circuit. Note that in the present embodiment, the same components as those of the first embodiment are designated by the same reference numerals, and the description thereof will be omitted.

In FIG. 2, as in the case of the first embodiment, the memory cell array 11, the column decoders 12, the sense amplifiers 13, and the column selection switches 14 compose a memory circuit having a general structure. In FIG. 2, word selection signals WL (m:0) and a sense amplifier activation signal SAE are additionally provided to FIG. 1. When the sense amplifier activation signal SAE is in an active state, the sense amplifiers 13 amplify signals on pairs of bit lines BLT (n:0) and BLB (n:0).

Figure 3:
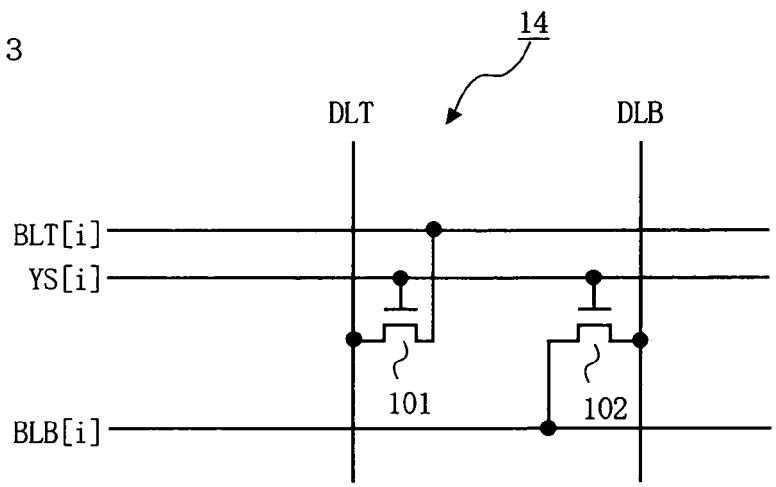
FIG. 3 is a circuit diagram of a column selection switch included in the semiconductor memory apparatus according to the second embodiment of the present invention.

FIG. 3 is a circuit diagram showing the detail of a column selection switch 14. Each column selection switch 14 includes NMOS transistors 101 and 102. In the i-th column selection switch 14 (where i is an integer greater than or equal to 0 and less than or equal ton), when a column selection signal YS (i) is in a selected state, an NMOS transistor 101 connects a bit line BLT (i) to a data line DLT, and an NMOS transistor 102 connects a bit line BLB (i) to a data line DLB.

The semiconductor memory apparatus shown in FIG. 2 has (n+1) fuse cells 30 whose number is equal to the number of pairs of bit lines of the memory cell array 11. Each fuse cell 30 is connected to one pair of the bit lines BLT (n:0) and BLB (n:0). All fuse cells 30 are connected to a fuse word selection signal WLF.

Figure 4:
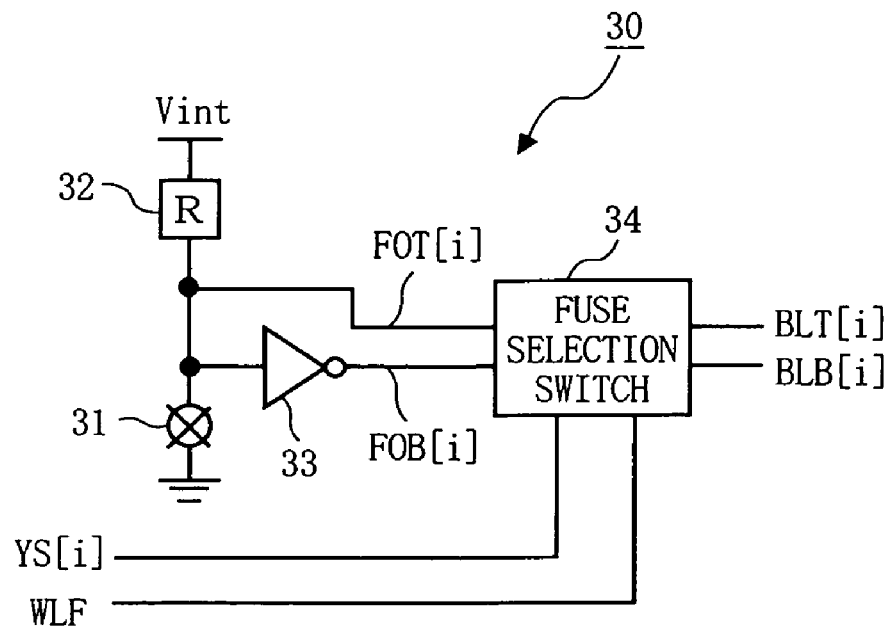
FIG. 4 is a diagram illustrating a configuration of a fuse cell included in the semiconductor memory apparatus according to the second embodiment of the present invention.

FIG. 4 is a diagram illustrating the detailed configuration of a fuse cell 30. Each fuse cell 30 includes a fuse 31, a resistor 32, an inverter 33, and a fuse selection switch 34. The fuse 31, the resistor 32, and the inverter 33 are connected to each other and operate in the same manner as the fuse 21, the resistor 22, and the inverter 23 shown in FIG. 1. Thus, when a fuse 31 is in a connected state, the potential of a signal line FOT (i) reaches substantially the ground level, and the potential of a signal line FOB (i) reaches the power supply voltage level. On the other hand, when the fuse 31 is in a disconnected state, the potential of the signal line FOT (i) reaches substantially the power supply voltage level, and the potential of the signal line FOB (i) reaches the ground level.

Figure 5:
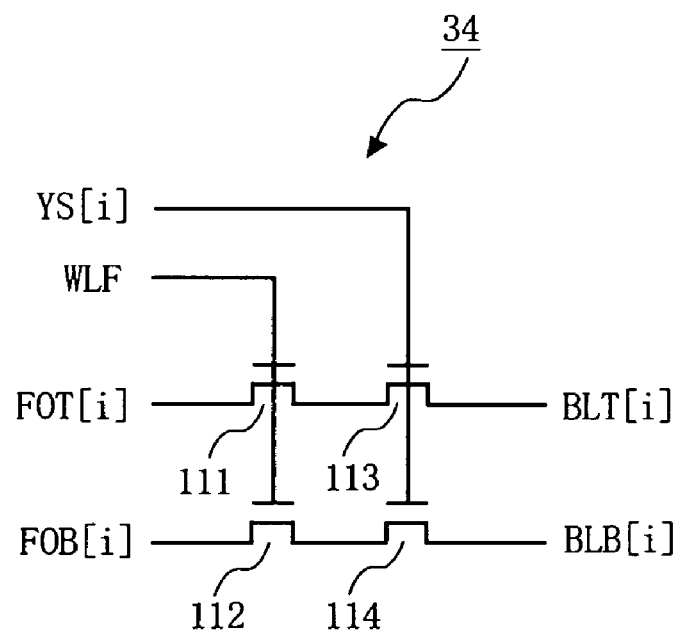
FIG. 5 is a circuit diagram of a fuse selection switch included in the semiconductor memory apparatus according to the second embodiment of the present invention.

FIG. 5 is a diagram illustrating the detailed configuration of a fuse selection switch 34. The fuse selection switch 34 includes NMOS transistors 111 to 114. In the i-th fuse selection switch 34 (where i is an integer greater than or equal to 0 and less than or equal to n), when both a fuse word selection signal WLF and a column selection signal YS (i) are in a selected state, the NMOS transistors 111 and 113 connect a signal line FOT (i) to a bit line BLT (i), and the NMOS transistors 112 and 114 connect a signal line FOB (i) to a bit line BLB (i).

The sequence of reading fuse data in the semiconductor memory apparatus shown in FIG. 2 will be described below. During a fuse data read cycle, all word selection signals WL (m:0) are controlled to be in a non-selected state, the fuse word selection signal WLF is controlled to be in a selected state, and one of column selection signals YS (n:0) is controlled to be in a selected state. For example, when a column selection signal YS (i) is in a selected state, signal lines FOT (i) and FOB (i) included in the i-th fuse cell 30 are connected to bit lines BLT (i) and BLB (i), respectively. By this, a pair of signals in accordance with the disconnection/non-disconnection state of a fuse 31 included in the i-th fuse cell 30 is outputted to the bit lines BLT (i) and BLB (i).

Subsequently, the sense amplifier activation signal SAE is controlled to be in an active state. By this, a sense amplifier 13 amplifies the pair of signals on the bit lines BLT (i) and BLB (i). The bit lines BLT (i) and BLB (i) are connected to the data lines DLT and DLB, respectively. In this manner, fuse data can be read from the selected fuse 31.

As described above, according to the semiconductor memory apparatus of the present embodiment, fuse data can be randomly read using the same reading sequence as that of memory data. Accordingly, the state of fuses can be easily checked, and fuse data can be easily read from application software. In addition, by allowing a column decoder for selecting a pair of bit lines of the memory cell to also function as a fuse selection circuit for selecting a fuse, and by using the bit lines of the memory circuit as the signal lines for outputting fuse data, the circuit size can be reduced and the circuit area can be reduced.

Figure 6:
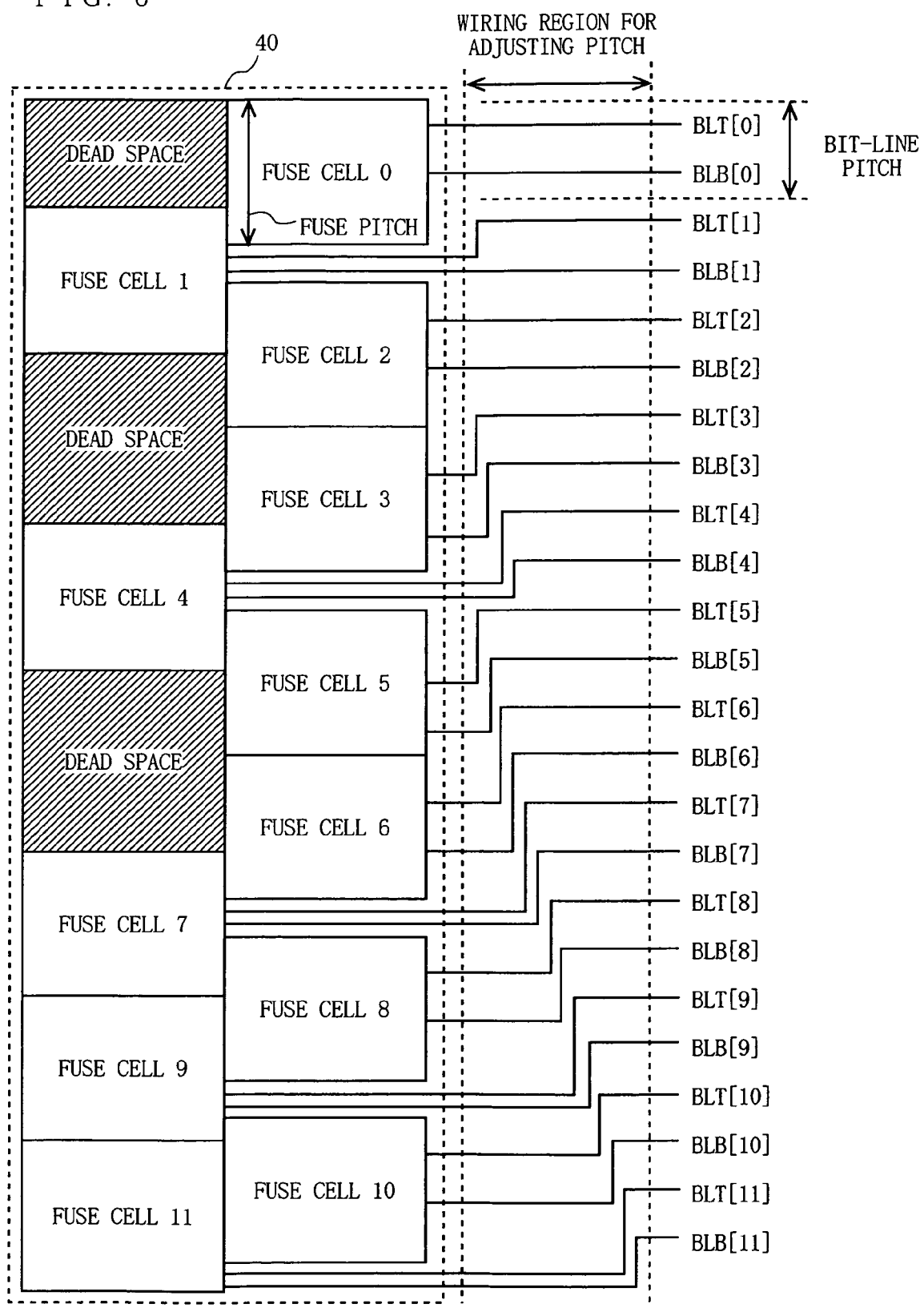
FIG. 6 is a layout diagram of fuse cells in the semiconductor memory apparatus.

The semiconductor memory apparatus (FIG. 2) according to the second embodiment has fuse cells 30 whose number is equal to the number of pairs of bit lines of the memory cell array 11. Thus, upon laying out a semiconductor memory apparatus, if the width of a fuse cell (hereinafter referred to as the "fuse pitch") is greater than the distance between a pair of bit lines (hereinafter referred to as the "bit-line pitch"), as shown in FIG. 6, the uniformity of the layout is spoiled, and as a result, dead space may be generated between fuse cells 40, or a superfluous wiring region may be created to adjust the pitch.

In view of the above-described problems, a semiconductor memory apparatus according to a third embodiment of the present invention is configured such that an arbitrary number of fuse cells 30 are removed from the semiconductor memory apparatus according to the second embodiment. Specifically, in the semiconductor memory apparatus according to the present embodiment, fuse cells whose number is less than the number of pairs of bit lines of a memory circuit are connected to the pairs of bit lines of the memory circuit.

Figure 7:
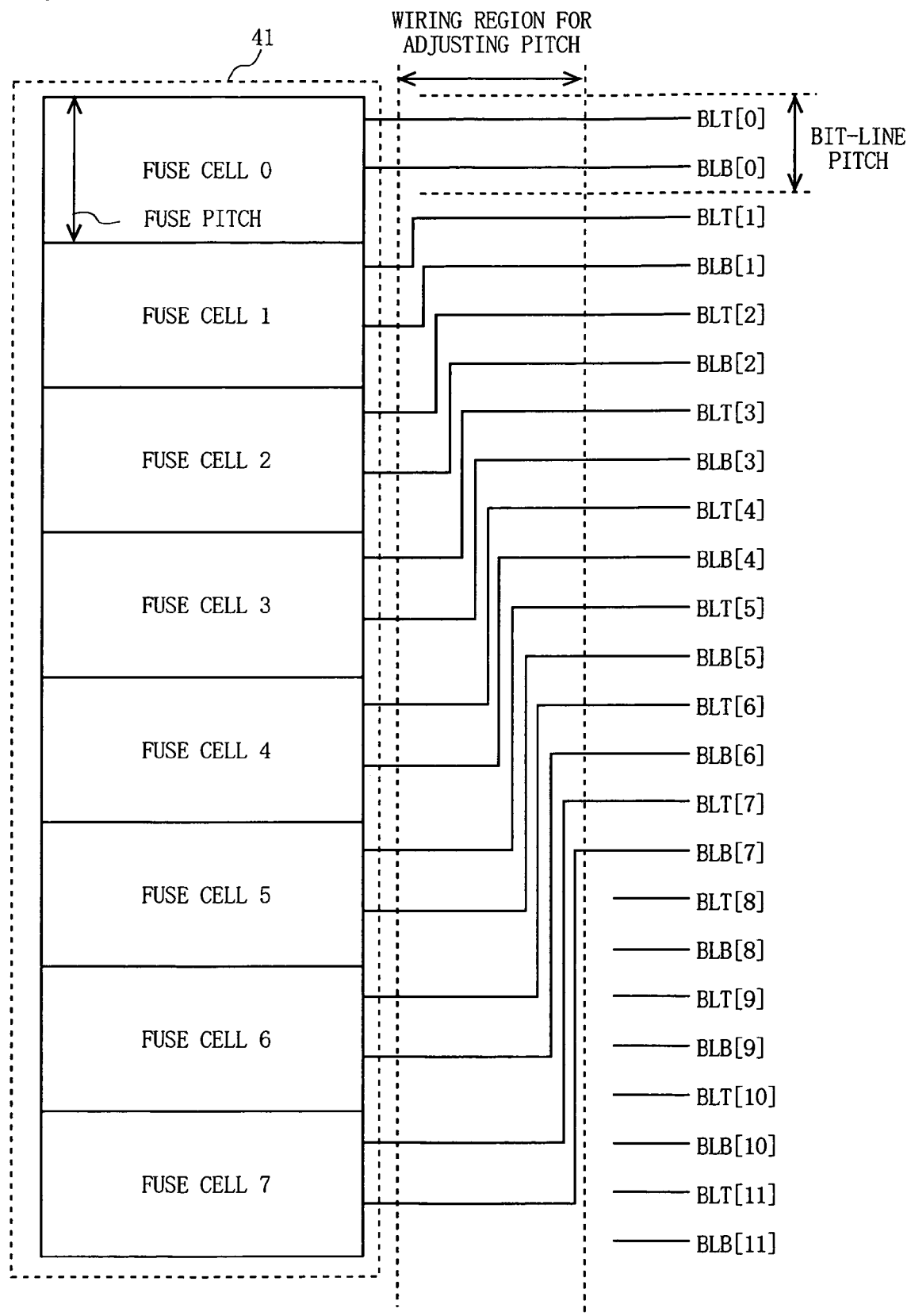
FIG. 7 is a layout diagram of fuse cells in a semiconductor memory apparatus according to a third embodiment of the present invention.

FIG. 7 is a layout diagram of fuse cells in the semiconductor memory apparatus according to the present embodiment. FIG. 7 shows the layout of eight fuse cells 41 and twelve pairs of bit lines BLT (11:0) and BLB (11:0) for the case where the fuse pitch is about 1.5 times the bit-line pitch. The eight fuse cells 41 are arranged in one column, and the twelve pairs of bit lines BLT (11:0) and BLB (11:0) are arranged in ascending order of bit number. In the layout shown in FIG. 7, of the twelve pairs of bit lines, eight pairs of bit lines BLT (7:0) and BLB (7:0) are connected to fuse cells 41 whereas the rest of four pairs of bit lines BLT (11:8) and BLB (11:8) are not connected to any fuse cell. By thus not putting a one-to-one correspondence between the fuse cells and the pairs of bit lines, the uniformity of the layout can be maintained.

As described above, according to the semiconductor memory apparatus of the present embodiment, by making the number of fuse cells less than the number of pairs of bit lines and by not connecting some pairs of bit lines to fuse cells, the uniformity of the layout can be maintained, and dead space generated between the fuse cells can be minimized.

Figure 8:
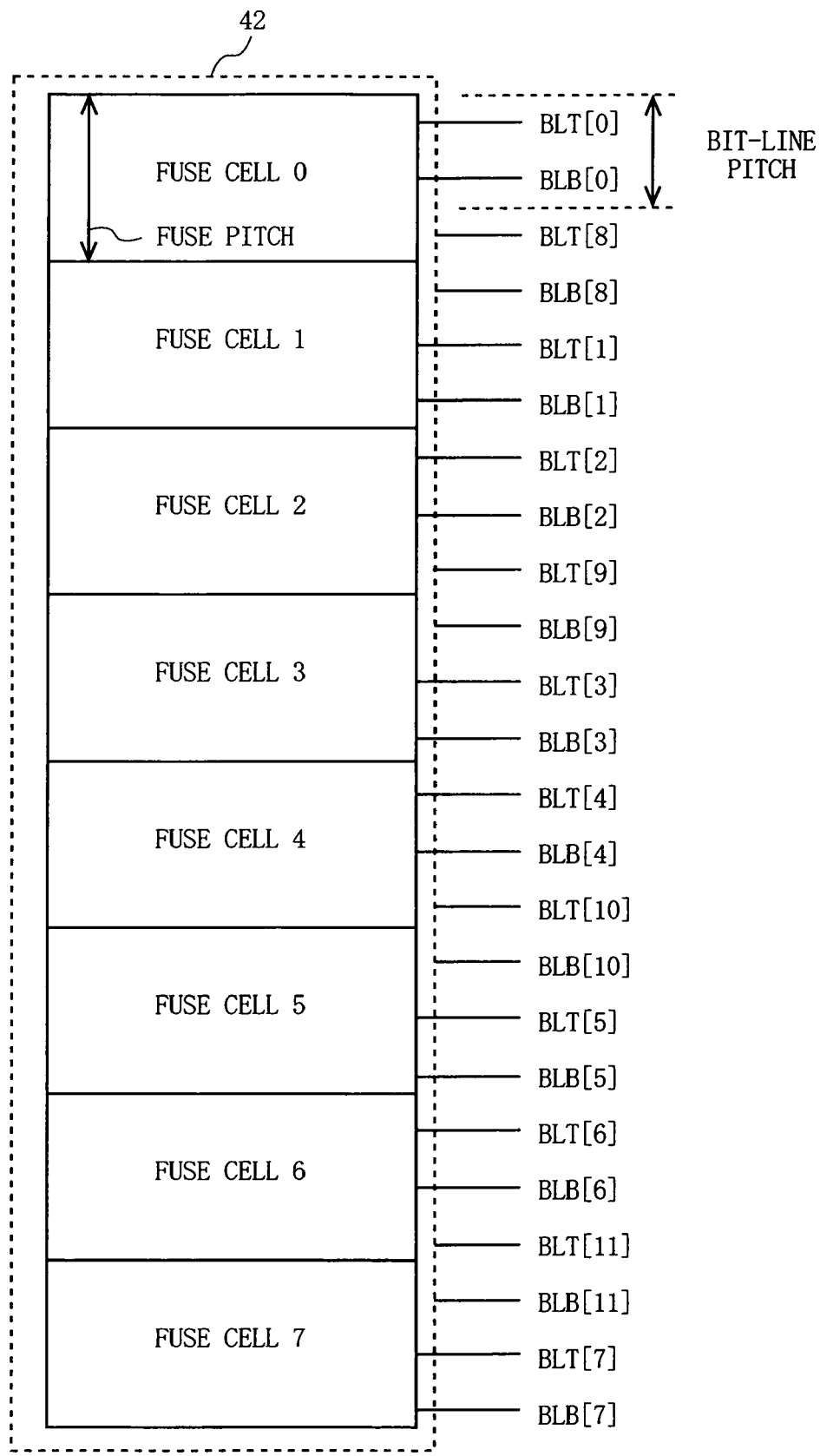
FIG. 8 is a layout diagram of fuse cells in a semiconductor memory apparatus according to a fourth embodiment of the present invention.

FIG. 8 is a layout diagram of fuse cells in a semiconductor memory apparatus according to a fourth embodiment of the present invention, which is designed under the same conditions as those of FIG. 7. In the layout shown in FIG. 8, eight pairs of bit lines BLT (7:0) and BLB (7:0) connected to fuse cells 42, and four pairs of bit lines BLT (11:0) and BLB (11:8) not connected to any fuse cell 42, are all arranged in a region where memory cells are arranged. More specifically, a pair of bit lines which is not connected to any fuse cell 42 is laid out so as to be sandwiched between two pairs of bit lines connected to fuse cells 42. In this case, by suitably laying out the fuse cells 42 and the pairs of bit lines, a wiring region for adjusting the fuse pitch and the bit-line pitch can be eliminated.

As described above, according to the semiconductor memory apparatus of the present embodiment, by making the number of fuse cells less than the number of pairs of bit lines, and by arranging pairs of bit lines connected to fuse cells and bit lines not connected to any fuse cell all in the memory cell region, the uniformity of the layout can be maintained, dead space generated between the fuse cells can be minimized, and the creation of a superfluous wiring region for adjusting the pitch can be prevented.

Figure 9:
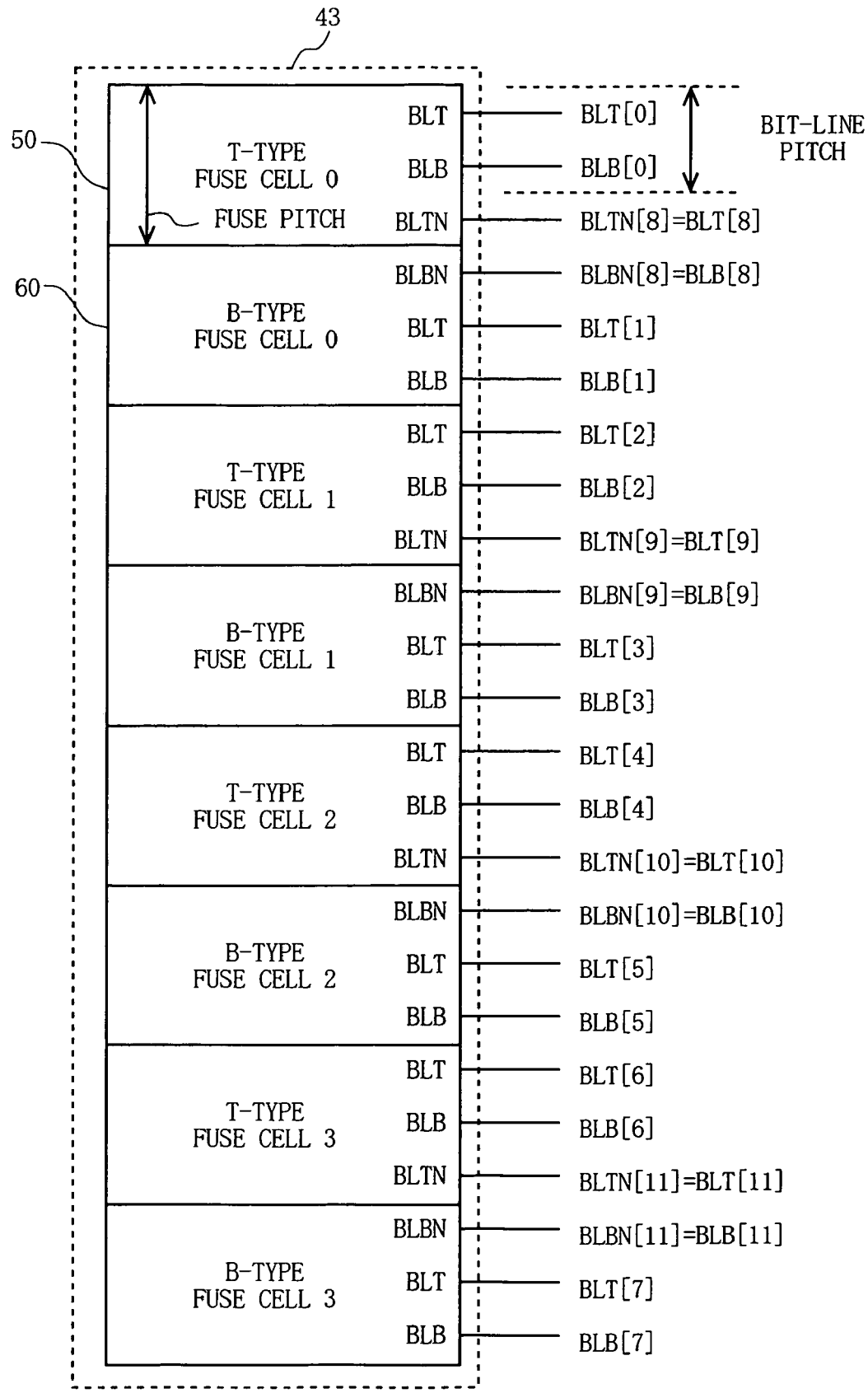
FIG. 9 is a layout diagram of fuse cells in a semiconductor memory apparatus according to a fifth embodiment of the present invention.

FIG. 9 is a layout diagram of fuse cells in a semiconductor memory apparatus according to a fifth embodiment of the present invention, which is designed under the same conditions as those of FIG. 7. FIG. 9 shows the layout of eight fuse cells 43 and twelve pairs of bit lines BLT (11:0) and BLB (11:0) for the case where the fuse pitch is about 1.5 times the bit-line pitch. In the layout shown in FIG. 9, as in the case of the layout shown in FIG. 8, eight pairs of bit lines connected to fuse cells 43 and four pairs of bit lines not connected to any fuse cell are all arranged in a memory cell region.

The semiconductor memory apparatus according to the present embodiment has two types of fuse cells. More specifically, the semiconductor memory apparatus shown in FIG. 9 has four T-type fuse cells 50 and four B-type fuse cells 60. The T-type fuse cells 50 and B-type fuse cells 60 each have two terminals BLT and BLB connected to a pair of bit lines. In addition, the T-type fuse cells 50 each have a terminal BLTN which outputs a high level signal, and the B-type fuse cells 60 each have a terminal BLBN which outputs a low level signal. In the layout, the T-type fuse cells 50 and the B-type fuse cells 60 are arranged alternately as shown in FIG. 9.

Of the twelve pairs of bit lines, eight pairs of bit lines BLT (7:0) and BLB (7:0) connected to fuse cells are each connected to the terminals BLT and BLB of either a corresponding T-type fuse cell 50 or a corresponding B-type fuse cell 60. Four pairs of bit lines BLT (11:8) and BLB (11:8) not connected to any fuse cell are each connected to either the terminal BLTN of a corresponding T-type fuse cell 50 or the terminal BLBN of a corresponding B-type fuse cell 60.

Column selection signals YS (i) and YS (j) are inputted to a T-type fuse cell 50 whose terminals BLT and BLB are connected to bit lines BLT (i) and BLB (i), respectively, and whose terminal BLTN is connected to a bit line BLT (j) (where i is an integer greater than or equal to 0 and less than the number of fuses, and j is an integer greater than or equal to the number of fuses and less than the number of pairs of bit lines). Column selection signals YS (i) and YS (j) are inputted to a B-type fuse cell 60 whose terminals BLT and BLB are connected to bit lines BLT (i) and BLB (i), respectively, and whose terminal BLBN is connected to a bit line BLB (j).

Figure 10:
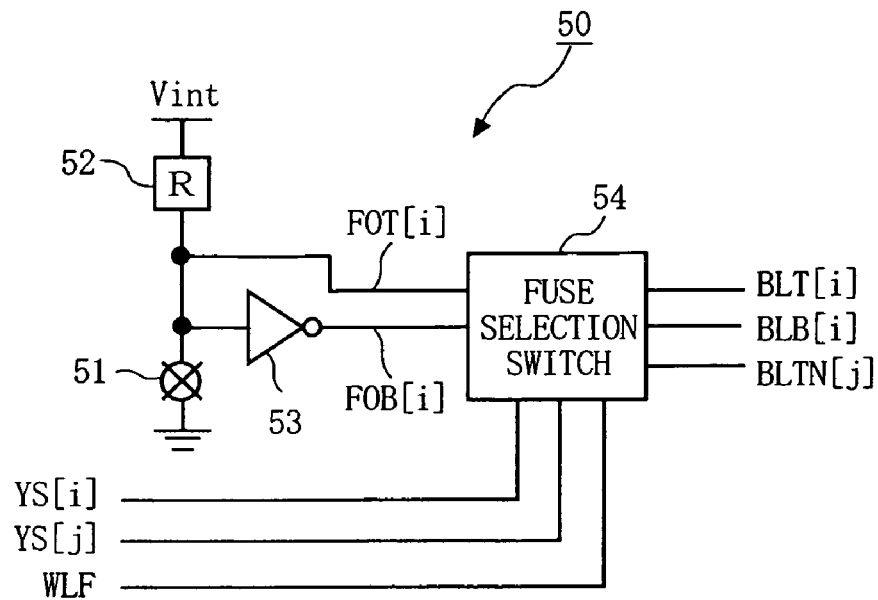
FIG. 10 is a diagram illustrating a configuration of a T-type fuse cell included in the semiconductor memory apparatus according to the fifth embodiment of the present invention.

FIG. 10 is a diagram illustrating the detailed configuration of a T-type fuse cell 50. The T-type fuse cell 50 includes a fuse 51, a resistor 52, an inverter 53, and a fuse selection switch 54. The fuse 51, the resistor 52, and the inverter 53 are connected to each other and operate in the same manner as the fuse 21, the resistor 22, and the inverter 23 shown in FIG. 1. Column selection signals YS (i) and YS (j) are inputted to the T-type fuse cell 50.

Figure 11:
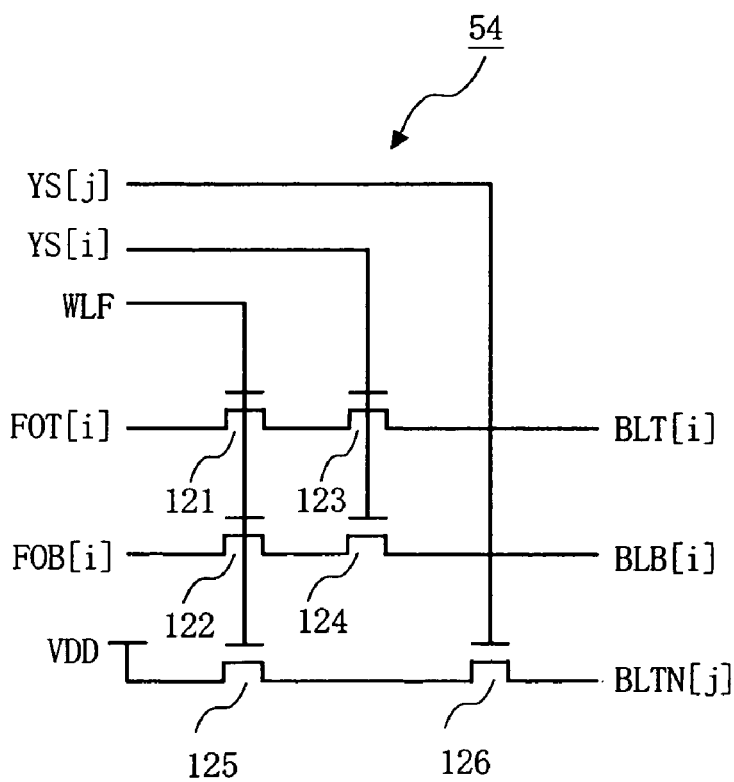
FIG. 11 is a circuit diagram of a fuse selection switch included in the T-type fuse cell of the semiconductor memory apparatus according to the fifth embodiment of the present invention.

FIG. 11 is a diagram showing the detail configuration of a fuse selection switch 54. The fuse selection switch 54 includes NMOS transistors 121 to 126. The NMOS transistors 121 to 124 operate in the same manner as the NMOS transistors 111 to 114 included in the fuse selection switch 34 shown in FIG. 5. When both a fuse word selection signal WLF and a column selection signal YS (j) are in a selected state, the NMOS transistors 125 and 126 connect a signal line BLTN (j) to a power supply terminal VDD. Accordingly, when reading fuse data, the signal line BLTN (j) is controlled to a high level.

Figure 12:
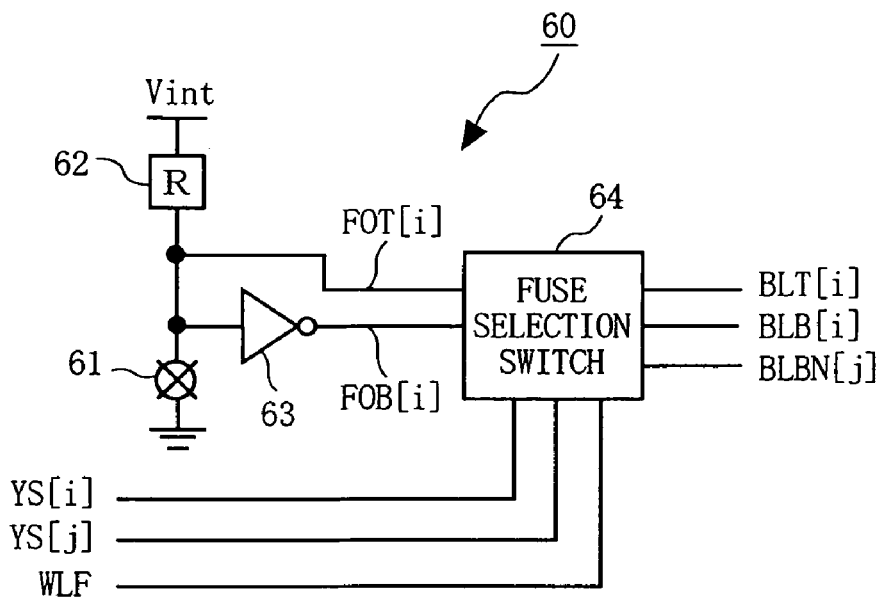
FIG. 12 is a diagram illustrating a configuration of a B-type fuse cell included in the semiconductor memory apparatus according to the fifth embodiment of the present invention.

FIG. 12 is a diagram illustrating the detailed configuration of a B-type fuse cell 60. The B-type fuse cell 60 includes a fuse 61, a resistor 62, an inverter 63, and a fuse selection switch 64. The fuse 61, the resistor 62, and the inverter 63 are connected to each other and operate in the same manner as the fuse 21, the resistor 22, and the inverter 23 shown in FIG. 1. Column selection signals YS (i) and YS (j) are inputted to the B-type fuse cell 60.

Figure 13:
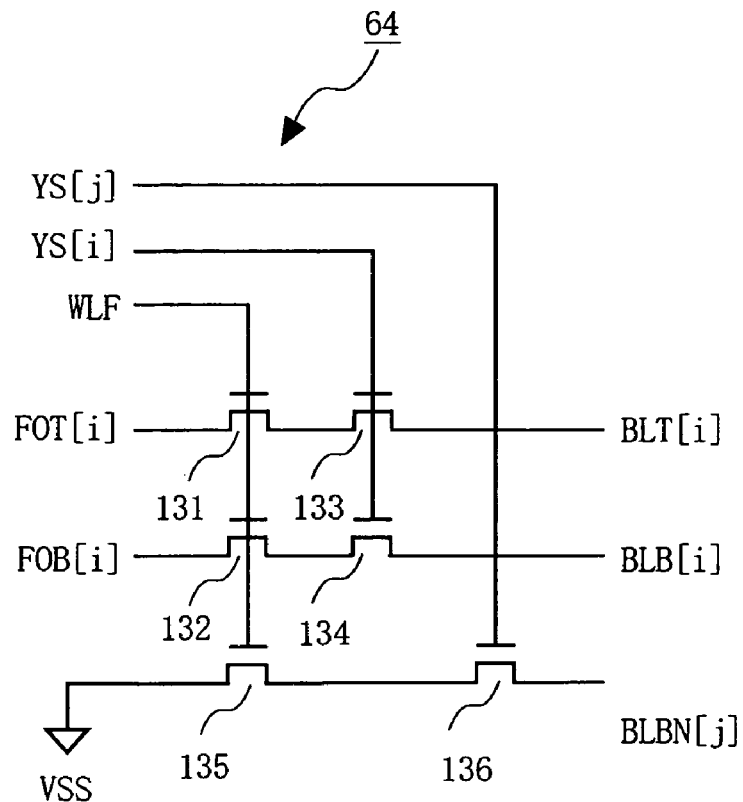
FIG. 13 is a circuit diagram of a fuse selection switch included in the B-type fuse cell of the semiconductor memory apparatus according to the fifth embodiment of the present invention.

FIG. 13 is a diagram illustrating the detailed configuration of a fuse selection switch 64. The fuse selection switch 64 includes NMOS transistors 131 to 136. The NMOS transistors 131 to 134 operate in the same manner as the NMOS transistors 111 to 114 included in the fuse selection switch 34 shown in FIG. 5. When both a fuse word selection signal WLF and a column selection signal YS (j) are in a selected state, the NMOS transistors 135 and 136 connect a signal line BLBN (j) to a ground terminal VSS. Accordingly, when reading fuse data, the signal line BLBN (j) is controlled to a low level.

In the T-type fuse cell 50, when both the fuse word selection signal WLF and the column selection signal YS (i) are in a selected state, a pair of signals in accordance with the disconnection/non-disconnection state of the fuse 51 is outputted from the terminals BLT and BLB. In the B-type fuse cell 60, the same operation is performed as in the T-type fuse cell 50. In addition, in the T-type fuse cell 50, when both the fuse word selection signal WLF and the column selection signal YS (j) are in a selected state, a signal with a voltage equal to the power supply voltage level is outputted from the terminal BLTN, and at the same time, a signal with a voltage equal to the ground level is outputted from the terminal BLBN of the B-type fuse cell 60.

In the case where in order to read data from a non-existent fuse, both a fuse word selection signal WLF and a column selection signal YS (j) (where j is an integer greater than or equal to the number of fuses and less than the number of pairs of bit lines) enter a selected state, the voltage of a bit line BLTN (j) reaches the power supply voltage level and the voltage of a bit line BLBN (j) reaches the ground level. Accordingly, since the voltages of the signals are the power supply voltage level and the ground level, the current necessary for the sense amplifier to amplify the signals can be reduced.

As described above, according to the semiconductor memory apparatus of the present embodiment, by fixing, when reading fuse data, pairs of bit lines not connected to any fuse cell to a predetermined potential corresponding to a low level or a high level, the power consumption of the sense amplifiers included in the memory circuit can be reduced.

Figure 14:
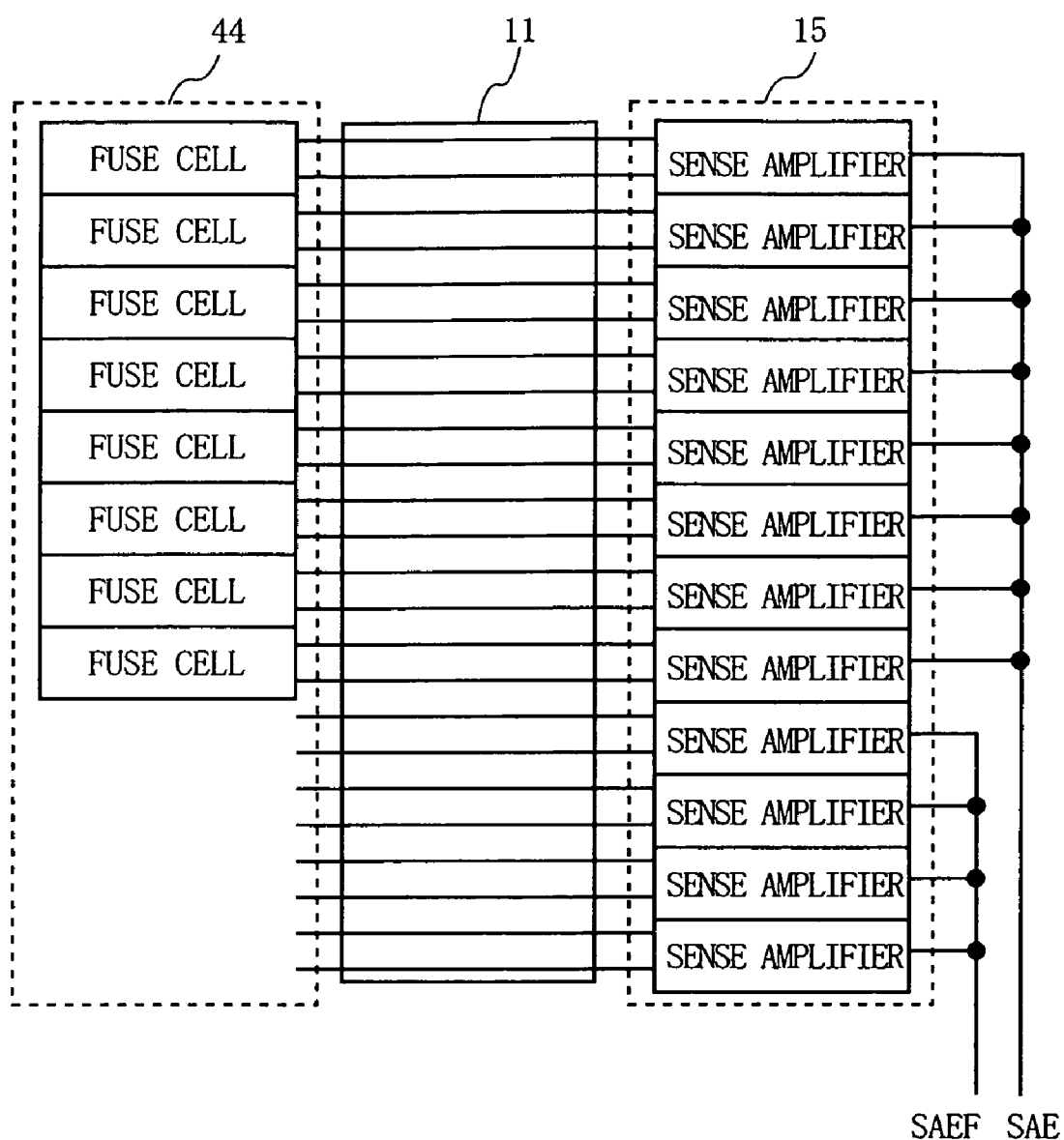
FIG. 14 is a diagram illustrating a state in which sense amplifier activation signals are fed to a semiconductor memory apparatus according to a sixth embodiment of the present invention.

FIG. 14 is a diagram illustrating a state in which sense amplifier activation signals are fed to a semiconductor memory apparatus according to a sixth embodiment of the present invention. The semiconductor memory apparatus shown in FIG. 14 has fuse cells 44 whose number is less than the number of pairs of bit lines of a memory circuit, as in the case of the semiconductor memory apparatuses according to the third to fifth embodiments. More specifically, the semiconductor memory apparatus has eight fuse cells 44, twelve pairs of bit lines, and twelve sense amplifiers 15. The pairs of bit lines and the sense amplifiers 15 are connected to one another in a one-to-one correspondence. Of the twelve pairs of bit lines, eight pairs of bit lines have the fuse cells 44 connected thereto, and the rest of four pairs of bit lines has no fuse cells connected thereto.

One of two types of control signals is inputted to the sense amplifiers 15 as the sense amplifier activation signal. A first sense amplifier activation signal SAE is fed to sense amplifiers 15 associated with pairs of bit lines having the fuse cells 44 connected thereto (in FIG. 14, the top eight sense amplifiers). A second sense amplifier activation signal SAEF is fed to sense amplifiers 15 associated with pairs of bit lines having no fuse cells 44 connected thereto (in FIG. 14, the bottom four sense amplifiers).

When reading memory data from the semiconductor memory apparatus shown in FIG. 14, the two sense amplifier activation signals SAE and SAEF are both controlled to be in an active state. At this time, all the sense amplifiers 15 are in operation and signals on all pairs of bit lines are amplified to a predetermined level. On the other hand, when reading fuse data, the first sense amplifier activation signal SAE is controlled to be in an active state, and the second sense amplifier activation signal SAEF is controlled to be in a non-active state. At this time, only some of the sense amplifiers 15 (the sense amplifiers to which the sense amplifier activation signal SAE is fed) are in operation, and signals on only some pairs of bit lines are amplified to a predetermined level.

As described above, according to the semiconductor memory apparatus of the present embodiment, when reading fuse data, by selectively activating only sense amplifiers which are connected to fuses, the power consumption of the sense amplifiers included in the memory circuit can be reduced.

Figure 15:
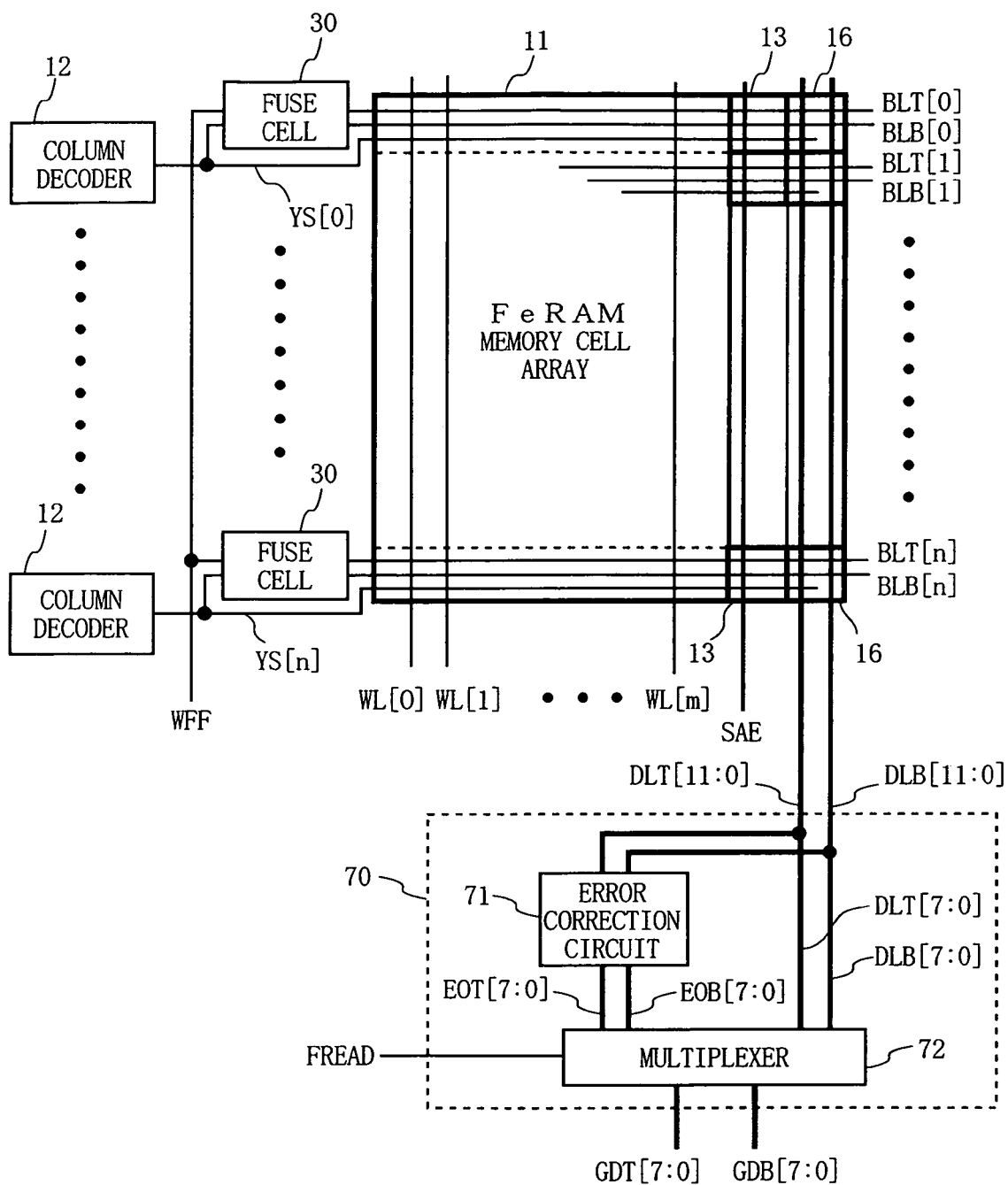
FIG. 15 is a diagram illustrating a configuration of a semiconductor memory apparatus according to a seventh embodiment of the present invention.

FIG. 15 is a diagram illustrating a configuration of a semiconductor memory apparatus according to a seventh embodiment of the present invention. The semiconductor memory apparatus shown in FIG. 15 includes a memory cell array 11, column decoders 12, sense amplifiers 13, column selection switches 16, fuse cells 30, and an output control circuit 70. That is, the semiconductor memory apparatus is configured by additionally providing to the semiconductor memory apparatus according to the second embodiment the output control circuit 70 which performs error correction. Such a semiconductor memory apparatus is generally called "ECC (Error Check and Correct)" memory. Note that in the present embodiment, the same components as those of the second embodiment are designated by the same reference numerals, and the description thereof will be omitted.

In FIG. 15, the memory cell array 11 includes data storage memory cells and error correction memory cells. The data storage memory cells store normal data to be stored in a memory circuit, and the error correction memory cells store data for error correction. In the present embodiment, plural-bit data (12-bit data in FIG. 15) is simultaneously read from the memory circuit. The column selection switches 16 connect twelve pairs of bit lines selected from pairs of bit lines BLT (n:0) and BLB (n:0) in accordance with column selection signals YS (n:0), to data lines DLT (11:0) and DLB (11:0).

The output control circuit 70 includes an error correction circuit 71 and a multiplexer 72. The data lines DLT (11:0) and DLB (11:0) and a fuse read signal FREAD are inputted to the output control circuit 70. During a fuse data read cycle, the fuse read signal FREAD is controlled to be in an active state.

The error correction circuit 71 performs an error correction process on signals on the data lines DLT (11:0) and DLB (11:0), and then outputs, as a result, pairs of signals EOT (7:0) and EOB (7:0). When the fuse read signal FREAD is in a non-active state, the multiplexer 72 outputs the pairs of signals EOT (7:0) and EOB (7:0) outputted from the error correction circuit 71, as output signals GDT (7:0) and GDB (7:0). On the other hand, when the fuse read signal FREAD is in an active state, the multiplexer 72 outputs a pair of signals including the lower 8 bits of the data as they are through the data lines DLT (7:0) and DLB (7:0), as output signals GDT (7:0) and GDB (7:0).

Figure 16:
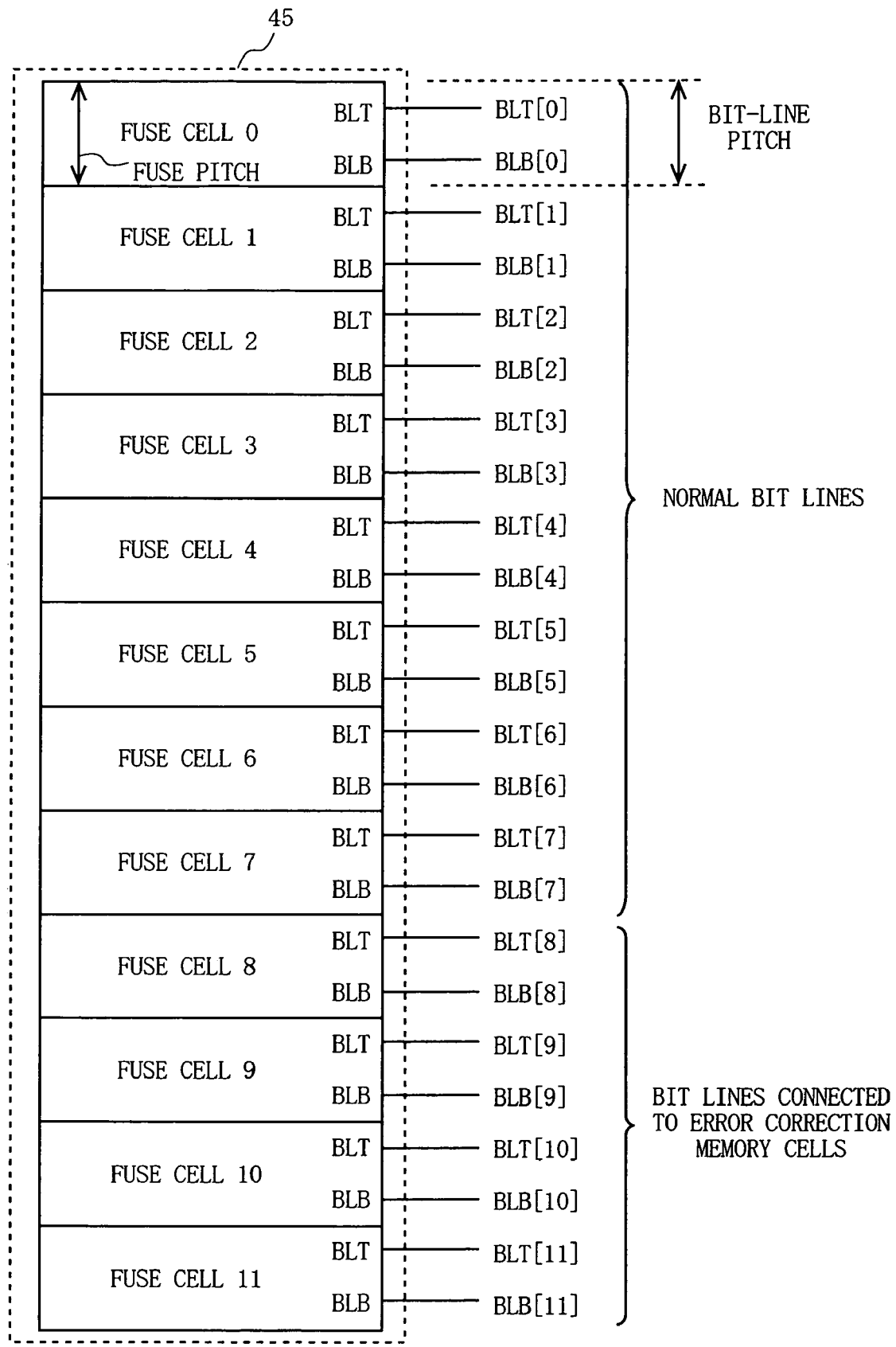
FIG. 16 is a layout diagram of fuse cells in the semiconductor memory apparatus according to the seventh embodiment of the present invention.

FIG. 16 is a layout diagram of fuse cells in the semiconductor memory apparatus according to the present embodiment. FIG. 16 shows the layout of twelve fuse cells 45 and twelve pairs of bit lines BLT (11:0) and BLB (11:0) for the case where the fuse pitch is substantially equal to the bit-line pitch. The twelve fuse cells 45 are arranged in one column, and the twelve pairs of bit lines BLT (11:0) and BLB (11:0) are arranged in ascending order of bit number. Note that the layout shown in FIG. 16 is merely one example and thus the layout of the semiconductor memory apparatus according to the present embodiment is not limited thereto.

Generally, the fuse data which is properly written has higher reliability than memory data. Therefore, ECC memory which performs error correction on memory data does not necessarily need to perform error correction on fuse data. Thus, the semiconductor memory apparatus according to the present embodiment has the output control circuit 70 configured in the above-described manner to perform error correction on memory data but not on fuse data. Hence, fuses which store error correction data may be in a connected or disconnected state. Accordingly, it becomes unnecessary to perform the process of disconnecting such fuses and the process of checking the disconnection/non-disconnection state of such fuses.

As described above, according to the semiconductor memory apparatus of the present invention, by controlling the output of the data lines using the above-described output control circuit, it becomes unnecessary to disconnect and check fuses which store error correction data, whereby the check cost can be reduced.

Figure 17:
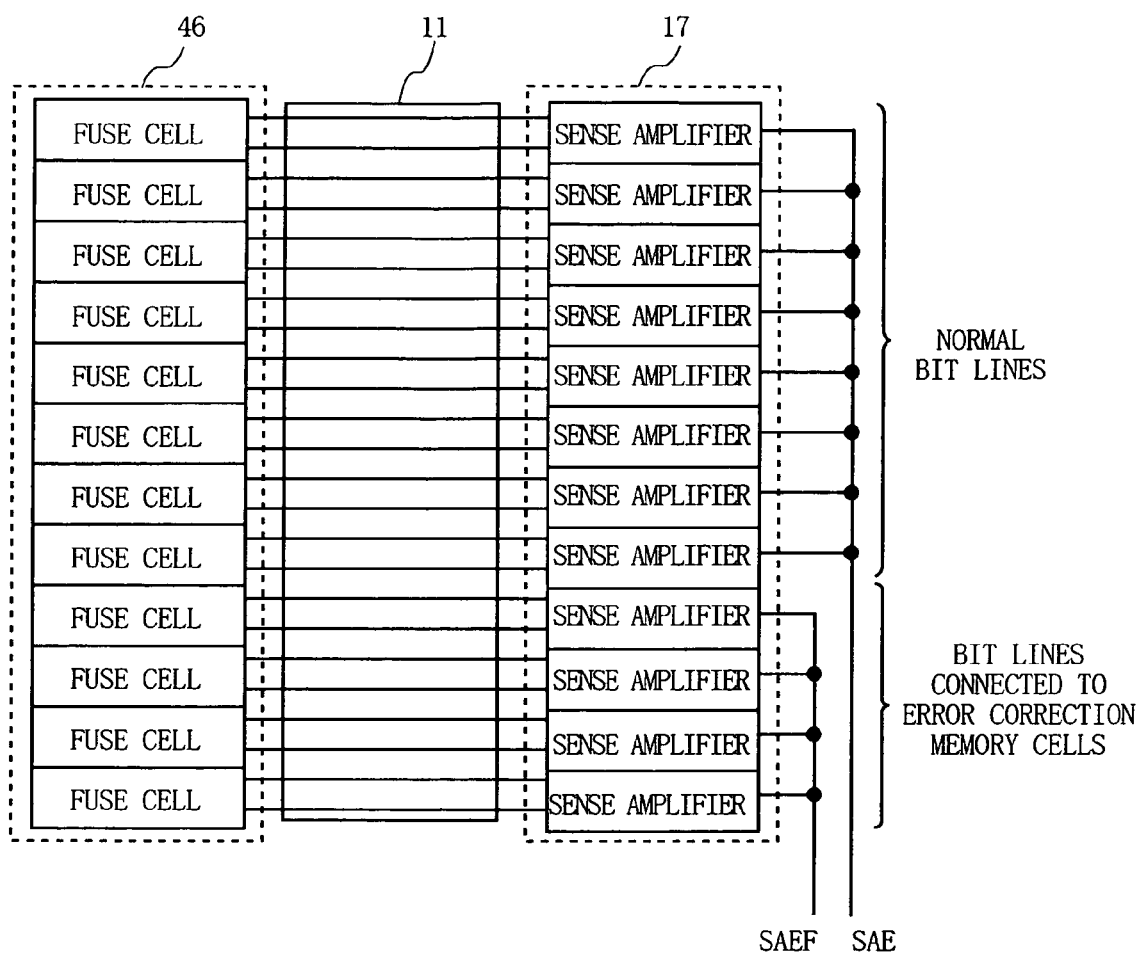
FIG. 17 is a diagram for describing a method of controlling sense amplifiers in a semiconductor memory apparatus according to a variant of the seventh embodiment of the present invention.

Note that the semiconductor memory apparatus according to the present embodiment may include fuse cells whose number is less than the number of pairs of bit lines of the memory circuit, as described in the third to fifth embodiments, or may be configured such that when reading fuse data, pairs of signals on corresponding pairs of bit lines which are not connected to any fuse cell are not amplified, as described in the sixth embodiment. For example, in the case where the technique described in the sixth embodiment is applied to the semiconductor memory apparatus according to the present embodiment, as shown in FIG. 17, two types of sense amplifier activation signals SAE and SAEF are fed. The semiconductor memory apparatus thus configured has the same advantages as those described in the sixth and seventh embodiments.

Figure 18:
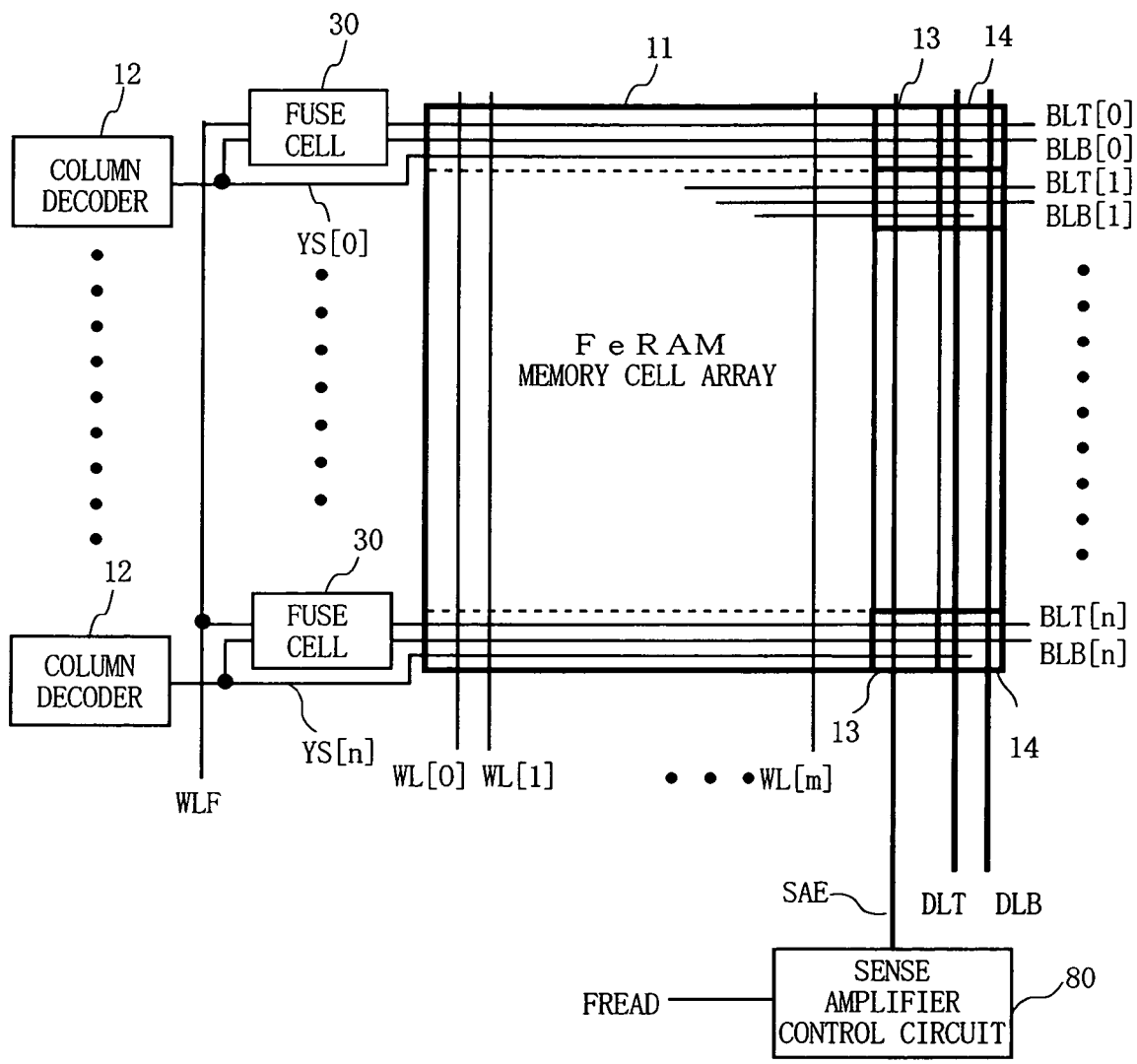
FIG. 18 is a diagram illustrating a configuration of a semiconductor memory apparatus according to an eighth embodiment of the present invention.
Figure 19:
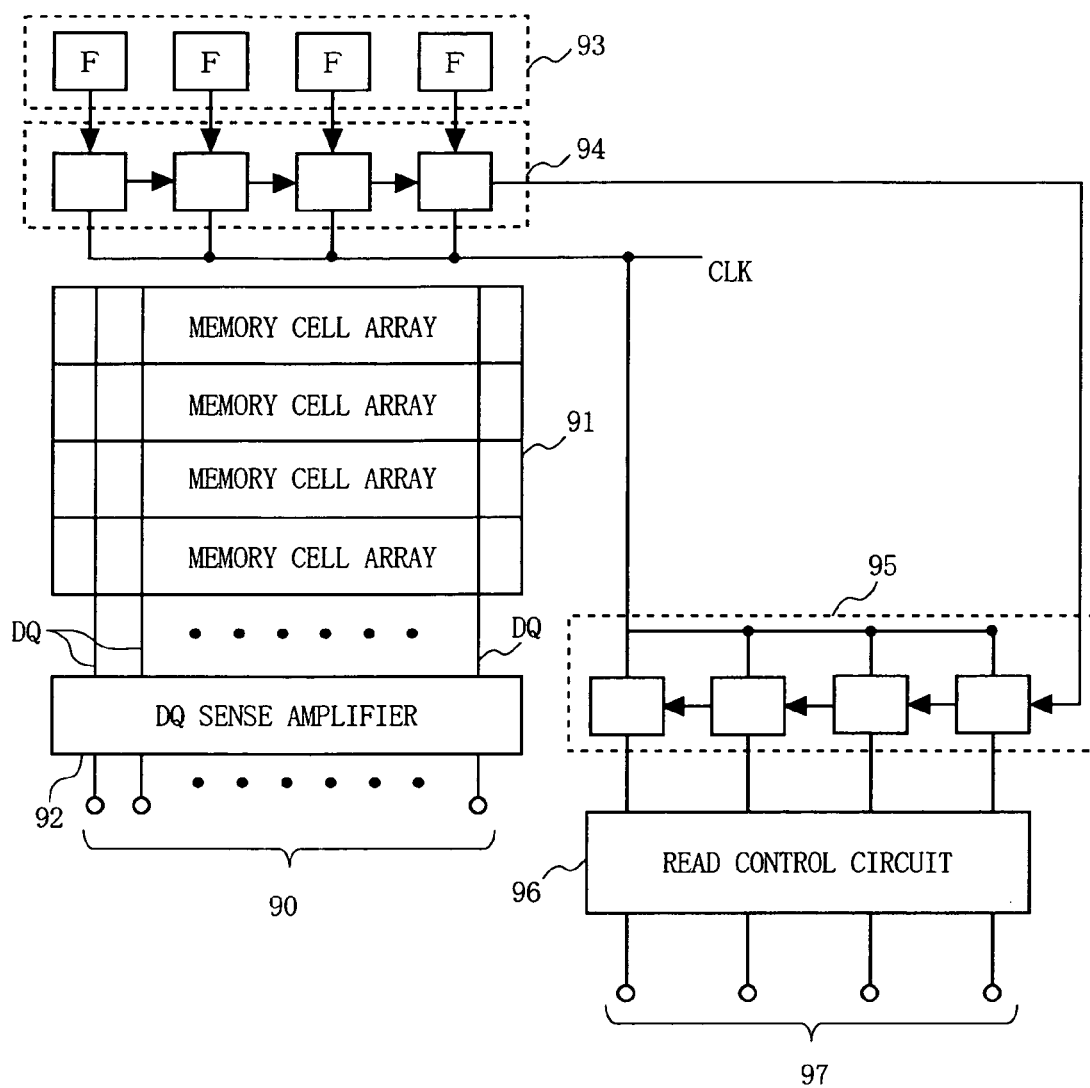
FIG. 19 is a diagram illustrating a configuration of a conventional semiconductor memory apparatus.

FIG. 18 is a diagram illustrating a configuration of a semiconductor memory apparatus according to an eighth embodiment of the present invention. The semiconductor memory apparatus shown in FIG. 18 includes a memory cell array 11, column decoders 12, sense amplifiers 13, column selection switches 14, fuse cells 30, and a sense amplifier control circuit 80. That is, the semiconductor memory apparatus is configured by additionally providing to the semiconductor memory apparatus according to the second embodiment the sense amplifier control circuit 80 for controlling the sense amplifiers 13. Note that in the present embodiment the same components as those of the second embodiment are designated by the same reference numerals, and the description thereof will be omitted.

In FIG. 18, a fuse read signal FREAD is controlled to be in an active state during a fuse data read cycle. When the fuse read signal FREAD is in anon-active state, the sense amplifier control circuit 80 controls a sense amplifier activation signal SAE to be in an active state. At this time, the sense amplifiers 13 amplify signals on pairs of bit lines BLT (n:0) and BLB (n:0). On the other hand, when the fuse read signal FREAD is in an active state, the sense amplifier control circuit 80 controls the sense amplifier activation signal SAE to be in a non-active state. At this time, the sense amplifiers 13 do not amplify signals on the pairs of bit lines BLT (n:0) and BLB (n:0).

Generally, the level of a signal to be outputted from a fuse cell 30 is higher than that of a signal to be outputted from a memory cell. Hence, in the case where the level (which corresponds to the amount of charge) of a signal outputted from a fuse cell 30 is sufficiently high, it is not necessary to amplify the signal. Therefore, the semiconductor memory apparatus according to the present embodiment has the sense amplifier control circuit 80 to amplify a signal to be outputted from a memory cell while not amplifying a signal to be outputted from a fuse cell 30. By this, the power consumption of the sense amplifiers 13 can be reduced.

As described above, according to the semiconductor memory apparatus of the present embodiment, when reading fuse data, pairs of signals on the pairs of bit lines of the memory circuit are not amplified, and thus the power consumption of the sense amplifiers can be reduced.

Although in the above-described embodiments, specific circuit examples of a fuse cell, a fuse selection switch, a column selection switch, an output control circuit, and the like are provided, the present invention is not limited to these circuits, and needless to say, other circuits having equivalent functions may also be used. For example, in the above-described embodiments, a physical fuse is used as a specific example of a fuse, however, an electrically disconnectable fuse may also be used.

Although, in the second to eighth embodiments, fuse cells are arranged at one end (the left-side end in the drawings) of the bit lines, fuse cells may be arranged at both ends of the bit lines. By adopting such a fuse cell arrangement, the fuse cells can be more efficiently arranged.

While the invention has been described in detail, the foregoing description is in all aspects illustrative and not restrictive. It is understood that numerous other modifications and variations can be devised without departing from the scope of the invention.

What is claimed is:

1. A semiconductor memory apparatus, comprising:
a plurality of memory cells;
bit lines which connect the memory cells;
a sense amplifier for amplifying a signal on a corresponding bit line;
a selection circuit for selecting at least one bit line from the bit lines;
a data line to be connected to the bit line selected by the selection circuit;
a plurality of fuses;
fuse data output circuits each for outputting a signal in accordance with a disconnection/non-disconnection state of a corresponding fuse;
a fuse selection circuit for selecting at least one circuit from the fuse data output circuits; and
a fuse selection switch for connecting, when reading corresponding fuse data, a corresponding fuse data output circuit selected by the fuse selection circuit to the data line.

2. A semiconductor memory apparatus, comprising:
a plurality of memory cells;
bit lines to be connected to the memory cells;
a sense amplifier for amplifying a signal on a corresponding bit line;
a selection circuit for selecting at least one bit line from the bit lines;
a data line to be connected to the bit line selected by the selection circuit;
a plurality of fuses;
fuse data output circuits each for outputting a signal in accordance with a disconnection/non-disconnection state of a corresponding fuse; and
a fuse selection switch for connecting, when reading corresponding fuse data, a corresponding fuse data output circuit to a corresponding bit line selected by the selection circuit.

3. The semiconductor memory apparatus according to claim 2, wherein the number of fuses is less than the number of bit lines, and the bit lines include:

a first bit line to be connected to a corresponding fuse data output circuit through a corresponding fuse selection switch; and a second bit line which is not connected to either a corresponding fuse selection switch or a corresponding fuse data output circuit.

4. The semiconductor memory apparatus according to claim 3, wherein the bit lines include a plurality of the first bit lines and a plurality of the second bit lines.

5. The semiconductor memory apparatus according to claim 3, wherein the bit lines include a plurality of the first bit lines and a plurality of the second bit lines, and the first bit lines and the second bit lines are all arranged in a region where the memory cells are arranged.

6. The semiconductor memory apparatus according to claim 3, wherein the bit lines include a plurality of the first bit lines and a plurality of the second bit lines, and each second bit line is fixed, when reading corresponding fuse data, to a predetermined potential corresponding to a low level or a high level.

7. The semiconductor memory apparatus according to claim 3, wherein the sense amplifier amplifies a signal on a corresponding first bit line and does not amplify a signal on a second bit line, when reading corresponding fuse data.

8. The semiconductor memory apparatus according to claim 2, further comprising:

an output control circuit for controlling an output of the data line, wherein the memory cells include:

a data storage memory cell for storing normal data; and an error correction memory cell for storing error correction data, wherein the output control circuit outputs, when reading memory data, a result obtained by performing error correction on data read from a corresponding data storage memory cell and a corresponding error correction memory cell, and outputs, when reading fuse data, data read from a corresponding data storage memory cell as it is.

9. The semiconductor memory apparatus according to claim 2, wherein the sense amplifier amplifies, when reading corresponding memory data, a signal on a corresponding bit line, and does not amplify, when reading corresponding fuse data, a signal on a corresponding bit line.

* * * * *